(12) United States Patent
Ohshima et al.

(10) Patent No.: US 8,450,699 B2
(45) Date of Patent: May 28, 2013

(54) ELECTRON BEAM DEVICE AND ELECTRON BEAM APPLICATION DEVICE USING THE SAME

(75) Inventors: Takashi Ohshima, Saitama (JP); Satoshi Tomimatsu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/133,947

(22) PCT Filed: Dec. 4, 2009

(86) PCT No.: PCT/JP2009/006637
§ 371 (c)(1),
(2), (4) Date: Jun. 10, 2011

(87) PCT Pub. No.: WO2010/070837
PCT Pub. Date: Jun. 24, 2010

(65) Prior Publication Data
US 2011/0240855 A1    Oct. 6, 2011

(30) Foreign Application Priority Data
Dec. 16, 2008  (JP) ................................ 2008-319859

(51) Int. Cl.
*G21K 7/00*  (2006.01)
*B01J 19/08*  (2006.01)
*H01J 9/04*  (2006.01)

(52) U.S. Cl.
USPC ................... 250/423 R; 250/423 F; 250/310; 250/309; 250/311; 315/111.21; 315/111.91

(58) Field of Classification Search
USPC ......... 250/309, 310, 311, 423 R; 315/111.21, 315/111.91
See application file for complete search history.

(56) References Cited

U.S. PATENT DOCUMENTS

| | | | |
|---|---|---|---|
| 5,616,926 A * | 4/1997 | Shinada et al. ............ | 250/423 F |
| 5,939,720 A * | 8/1999 | Todokoro ...................... | 250/310 |
| 5,993,636 A | 11/1999 | Terui et al. | |
| 6,583,413 B1 * | 6/2003 | Shinada et al. ................... | 850/9 |

(Continued)

FOREIGN PATENT DOCUMENTS

| | | |
|---|---|---|
| JP | 8-339773 A | 12/1996 |
| JP | 9-283068 A | 10/1997 |

(Continued)

OTHER PUBLICATIONS

T. Ohshima et al., Study of Energy Distribution of Schottky Emitted Electrons and its Theoretical Analysis using Effective Mass Approximation, Jpn. J. Appl. Phys. vol. 42, Part 1, No. 10, Oct. 2003, pp. 6564-6568.

*Primary Examiner* — David A Vanore
(74) *Attorney, Agent, or Firm* — Mattingly & Malur, PC

(57) ABSTRACT

To obtain a SEM capable of both providing high resolution at low acceleration voltage and allowing high-speed elemental distribution measurement, a SE electron source including Zr—O as a diffusion source is shaped so that the radius r of curvature of the tip is more than 0.5 μm and less than 1 μm, and the cone angle α of a conical portion at a portion in the vicinity of the tip at a distance of 3r to 8r from the tip, is more than 5° and less than (8/r)°. Another SE electron source uses Ba—O and includes a barium diffusion supply means composed of a sintered metal and a barium diffusion source containing barium oxide.

14 Claims, 10 Drawing Sheets

U.S. PATENT DOCUMENTS

| | | | |
|---|---|---|---|
| 6,633,831 B2 * | 10/2003 | Nikoonahad et al. | 702/155 |
| 6,673,637 B2 * | 1/2004 | Wack et al. | 438/14 |
| 6,694,284 B1 * | 2/2004 | Nikoonahad et al. | 702/155 |
| 6,782,337 B2 * | 8/2004 | Wack et al. | 702/155 |
| 6,798,126 B2 * | 9/2004 | Schwind et al. | 313/309 |
| 6,806,951 B2 * | 10/2004 | Wack et al. | 356/237.2 |
| 6,825,597 B2 * | 11/2004 | Suguro | 313/359.1 |
| 6,828,565 B2 * | 12/2004 | Steigerwald | 250/423 P |
| 6,936,972 B2 * | 8/2005 | Takeuchi et al. | 315/169.3 |
| 7,006,235 B2 * | 2/2006 | Levy et al. | 356/600 |
| 7,098,455 B2 * | 8/2006 | Shinada et al. | 250/310 |
| 7,521,675 B2 * | 4/2009 | Kawasaki et al. | 250/310 |
| 7,556,749 B2 * | 7/2009 | Terui et al. | 252/518.1 |
| 7,868,307 B2 * | 1/2011 | Kruit | 250/492.22 |
| 8,168,951 B2 * | 5/2012 | Kawasaki et al. | 250/310 |
| 2003/0205958 A1 * | 11/2003 | Schwind et al. | 313/309 |
| 2009/0184243 A1 * | 7/2009 | Kawasaki et al. | 250/310 |
| 2010/0127170 A1 | 5/2010 | Fujita et al. | |
| 2011/0186735 A1 * | 8/2011 | Fujieda et al. | 250/311 |
| 2011/0240855 A1 * | 10/2011 | Ohshima et al. | 250/310 |
| 2012/0169210 A1 * | 7/2012 | Morishita | 313/310 |

FOREIGN PATENT DOCUMENTS

| | | |
|---|---|---|
| JP | 11-031453 A | 2/1999 |
| JP | 11-224629 A | 8/1999 |
| JP | 2005-339922 A | 12/2005 |
| JP | 2007-250491 A | 9/2007 |
| JP | 2009-541966 A | 11/2009 |
| WO | 2008/001030 A1 | 1/2008 |

* cited by examiner (a)

(b)

(a)

(b)

(c)

(a)

(b)

(a)

(b)

(c)

ELECTRON BEAM DEVICE AND ELECTRON BEAM APPLICATION DEVICE USING THE SAME

TECHNICAL FIELD

The present invention relates to an electron beam apparatus and an electron beam application apparatus using the same, which electron beam apparatus has functions such as high resolution analysis at low acceleration voltage and elemental analysis at high speed at a large current. Specifically, the present invention relates to a scanning electron microscope (SEM) for the observation of microstructures using electron beams.

BACKGROUND ART

A Schottky emission electron source (hereinafter also briefly referred to as "SE electron source") is used in scanning electron microscopes (SEM) with a high resolution at low acceleration voltage and electron irradiation apparatuses for element analyses at high speed with X rays, because the SE electron source gives monochromatic, highly bright electron beams and easily provides a large probe current. This electron source includes a single-crystal tungsten (100) rod having a diameter of about 0.1 mm, the tip (apex) of the rod is sharpened, the surface of which is allowed to adsorb zirconium (Zr) and oxygen (O) to selectively allow the (100) plane alone to have a lower work function of about 2.8 eV. The single-crystal tungsten rod is fixed on a heater composed of tungsten filament and is heated to a temperature of about 1800 K upon use.

It has been believed that such customary Schottky electron sources using the ZrO/W system preferably have a large radius r of curvature of the tip of the electron source, in order to obtain a large-current probe and to give electron beams which have a uniform energy width, namely, which are monochromatic. This is disclosed typically in Patent Literature (PTL) 1. PTL 1 mentions that the radius r of curvature is preferably 1 μm or more and 2 μm or less.

Independently, an electron source preferably has such a shape that an electric field focuses on the vicinity of the tip of electron source, and the tip should have a radius r of curvature and a cone angle (opening angle) α within certain ranges, so as to be an electron source with high brightness. This is disclosed typically in PTL 2. PTL 2 mentions that the electron source has a radium r of curvature in the range of from 0.2 μm to 0.5 μm, and a cone angle α in the range of from 5° to 8°.

For obtaining an electron source being more monochromatic and giving a larger current, the electron source should have a surface structure having a work function lower than that of the electron source using Zr—O/W and is capable of operating at low temperatures. The electron source using Zr—O/W has a work function of 2.8 eV and an operating temperature of around 1800 K, whereas the electron source using Ba—O/W has a work function of about 1.0 to about 1.5 eV and an operating temperature of around 1000 to 1200 K and shows an energy width approximately half the energy width of the electron source using Zr—O/W. This is described in Non Patent Literature (NPL) 1 in FIG. 4 and in description from the beginning of Section 6.2 to 4th line therebelow in the right hand of page 441.

The Schottky electron source containing barium has a problem of being unstable in diffusion. To improve this problem, there is disclosed a technique of adding a reductant to a diffusion source provided in the mid-slope of a single-crystal tungsten needle serving as an electron source. This technique is disclosed typically in PTL 3 with candidates of various elements and compounds as materials therefor.

CITATION LIST

Patent Literature

PTL 1: Japanese Patent Application Laid-Open Publication (JP-A) No. 2005-339922
PTL 2: Japanese Patent Application Laid-Open Publication (JP-A) No. H09-283068
PTL 3: Japanese Patent Application Laid-Open Publication (JP-A) No. H11-224629

Non Patent Literature

NPL 1: T. Ohshima, H. Nishiyama: "Study of Energy Distribution of Schottky Emitted Electrons and its Theoretical Analysis using Effective Mass Approximation", Jpn. J. Appl. Phys., Vol. 42(2003), pp. 6564-6565

SUMMARY OF INVENTION

Technical Problem

According to the known techniques, an electron source, if having a large radius r of curvature at its tip, has a low brightness, and the extraction size of power supply, size of insulators, and aberration become large with an increasing voltage. In contrast, an electron source, if having a small radius r of curvature at its tip, causes larger chromatic aberration due to Boersch effect and thereby causes the resulting apparatus to have a low resolution. In the Boersch effect, the energy width is widened at a large current due to a space charge effect.

The SE electron source using a Ba—O-containing oxide as a diffusion source has problems in stability such that the electron source, when operated at a low operating temperature of about 1000 K, is unstable in electron emission and is continuously usable only for a short duration of about one month.

Solution to Problem

Of the problems, to address the problem of a high extraction voltage even being monochromatic or of a wide energy width even having a high brightness, an electron source is shaped so that the radius r of curvature of the tip is larger than 0.5 μm and smaller than 1 μm, and the cone angle α of a conical portion at a portion adjacent to the tip, i.e., in a position at a distance of 3r to 8r from the tip, is larger than 5° and smaller than $(8/r)°$, wherein r is indicated in units of micrometers (μm).

To obtain an electron source being furthermore monochromatic, barium (Ba) is used instead of zirconium (Zr), to constitute a barium diffusion supply means, which barium diffusion supply means is composed of a porous sintered metal and a barium diffusion source (barium reservoir) containing Ba—O.

The present invention has been made while focusing on an SE electron source which includes a sintered metal and a barium diffusion source containing barium oxide and which is useful for the observation of SEM images with a high resolution at low acceleration voltage.

Advantageous Effects of Invention

The configurations allow an SE electron source to maintain a monochromatic and high-brightness region and to maintain high brightness without broadening the energy width even at a large current; and this gives an electron beam apparatus which has a high resolution at low acceleration voltage and which includes a high speed element analysis system.

DESCRIPTION OF EMBODIMENTS

Embodiments of the present invention will be illustrated with reference to some working examples below.

Embodiment 1

Figure 1:
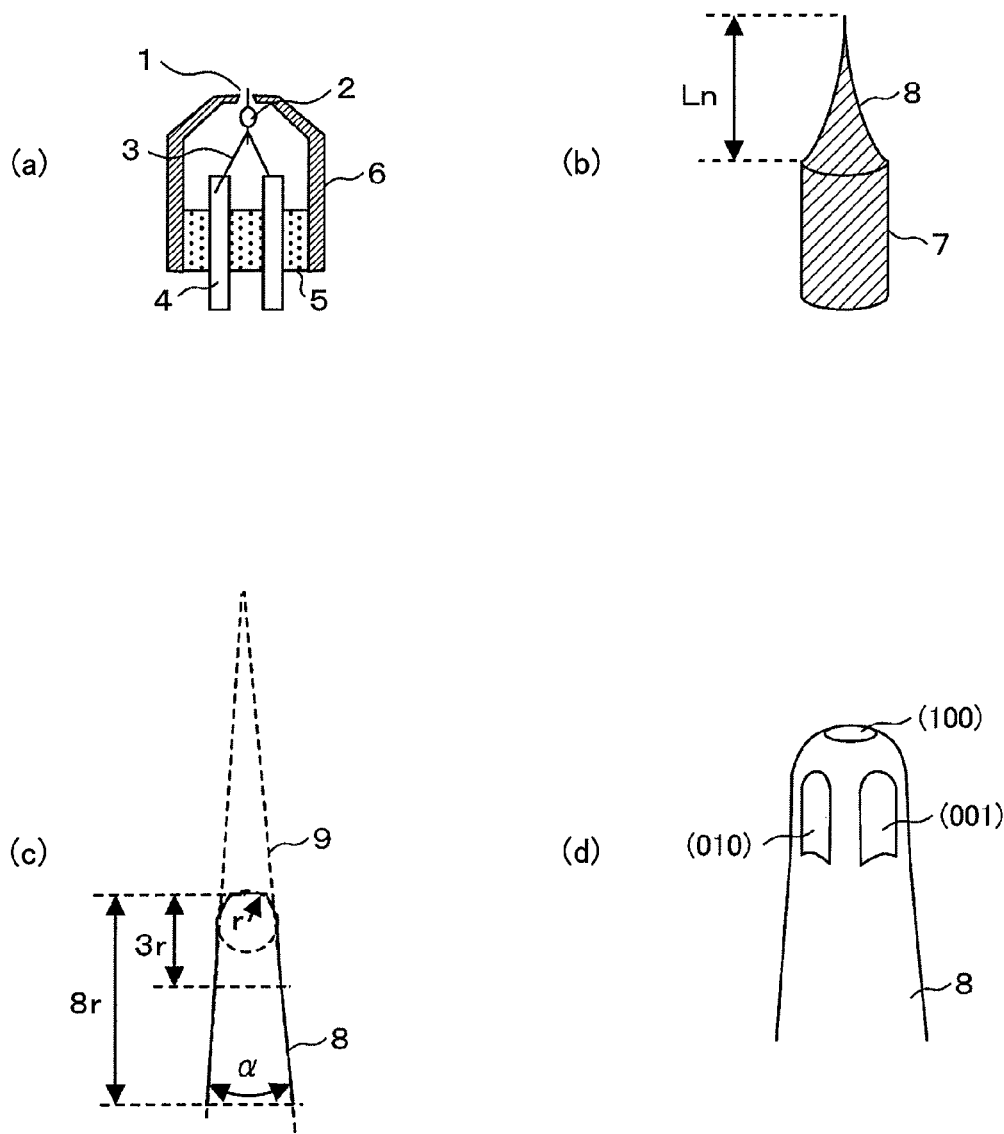
FIG. 1 depicts views (a), (b), (c), and (d) illustrating embodiments of the present invention.

FIG. 1 depicts an electron beam application apparatus as an embodiment of the present invention.

The electron beam application apparatus illustrated in FIG. 1(a) includes a tungsten needle 1, as well as a heater 3 and a Zr—O diffusion source 2 both supporting the tungsten needle 1. The tungsten needle 1 serves as an electron emission source. The heater 3 is composed of tungsten filaments. These components are held on an insulator 5 and electrodes 4 and are covered by a suppressor 6 which suppresses thermal electrons. With reference to FIG. 1(b), the tungsten needle (single-crystal tungsten metal needle) 1 has a needle-shaped tip 8. The needle-shaped tip 8 is a portion (this portion is hereinafter temporarily referred to as "constricted region") extending from a cylindrical portion of the single-crystal tungsten rod to the tip. The needle-shaped tip 8 has a length Ln of preferably 200 μm or less for maintaining the strength of the needle and providing a suitably short diffusion length. The tip region has such a microstructure that the tip has a radius r of curvature of more than 0.5 μm and less than 1 μm, in which the radius r of curvature is defined as the radius of a sphere when the tip is approximated as a semi-sphere. The tip also has a cone angle (opening angle) α of more than 5° and less than $(8/r)°$ in which the cone angle is defined as the opening angle of a cone when a portion from the tip to the vicinity of the needle-shaped tip 8 is approximated as a part of a cone 9. In these definitions, the radius r of curvature is indicated in units of micrometers (μm). When the conical portion to be approximated in the vicinity of the tip is imprecise, a portion in the vicinity of the tip, i.e., in a position at a distance of 3r to 8r from the tip, may be defined as the cone 9 to be approximated, as illustrated in FIG. 1(c). This is a narrower definition of the cone angle α.

Advantages this electron source based on its shape will be illustrated using an embodiment where the electron source is applied to an electron beam apparatus or SEM.

Figure 2:
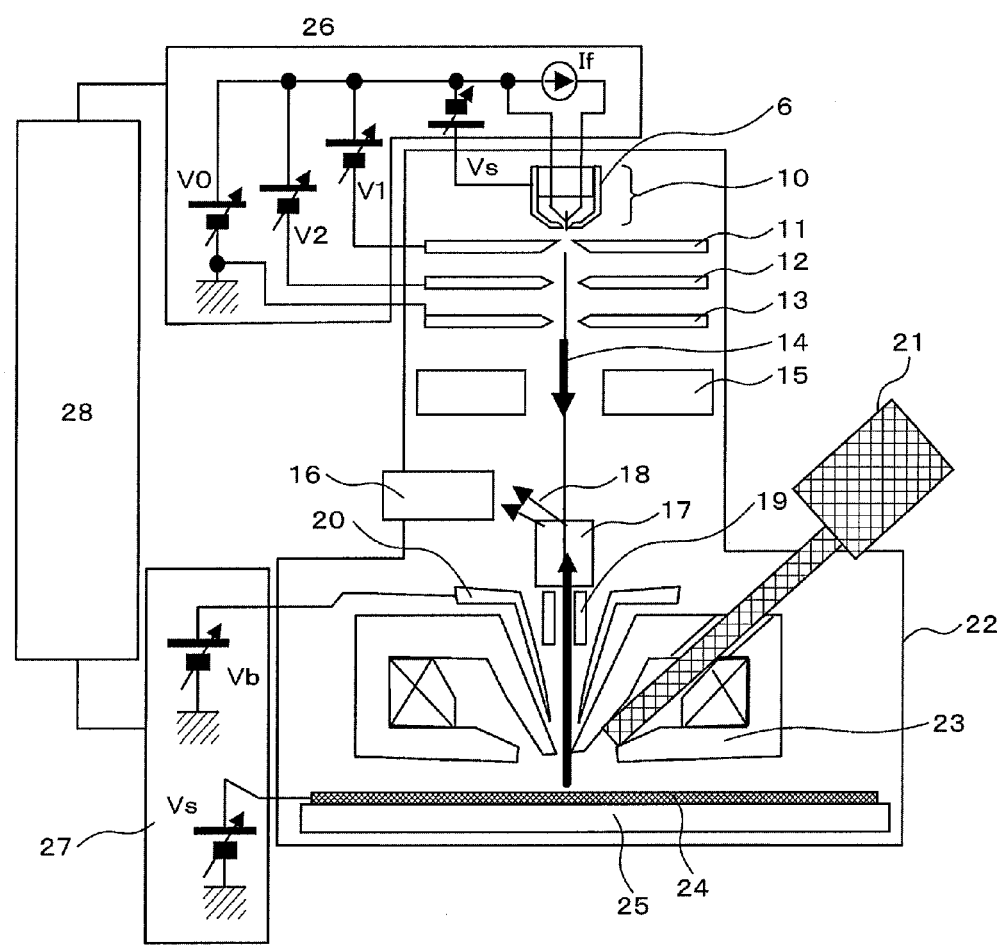
FIG. 2 is a view illustrating an embodiment of the present invention.

FIG. 2 depicts a schematic diagram of an embodiment where the electron source 10 is applied to a scanning electron microscope (SEM).

An extraction electrode 11 is arranged so as to face the bottom of the suppressor electrode 6 of the electron source 10 with a spacing between the two components of about 0.7 mm. The needle-shaped tip 8 of the electron source protrudes from the bottom of the suppressor 6 toward the extraction electrode by about 0.2 to 0.3 mm. An electron gun power supply applies an extraction voltage V1 to allow the electron source to emit a probe electron 14 at a desired current. The electron beam is allowed to have desired electrooptic conditions by the action of an acceleration voltage V0 and a first anode voltage V2 and comes into a focus on a sample 24 by the action of components mainly including a condenser lens 15 and an objective lens 23. A deflector 19 scans the focal position, and detection electrons 18 emitted from the sample are detected via an ExB deflector 17 by an electron detector 16, converted into electric signals, and thereby give an SEM image on a controller 28.

This apparatus has two operation modes, i.e., a high resolution at low acceleration mode and a high speed element analysis mode. The high resolution at low acceleration mode is employed at an incident energy to the sample in the range of from about 50 eV to about 1 keV. The condition is important for the observation of a sample, such as a semiconductor or nano-material, which is fine and fragile to charging or to electron beam impact. Under the low acceleration voltage condition, the blur (dc) of the image due to chromatic aberration is proportional to the energy width (E) of the electron beam and is inversely proportional to the electron energy (Vobj) passing through the objective lens 23, thus the blur dc is proportional to E/Vobj (dc∝E/Vobj). For this reason, a power supply 27 applies a voltage Vb for accelerating the electron to a booster electrode 20 arranged above the objective lens, and simultaneously applies a retarding voltage Vs for retarding the electron to the sample 24.

Under an exemplary condition in the observation with a high resolution, there are applied V0 of −3 kV, Vb of +1 kV to +5 kV, and Vr of −2.5 kV. In this case, observation with a high resolution of about 1.2 nm is possible. This is because, although incident electrons to the sample each have a low energy of Vs−V0 of 0.5 kV, electrons accelerated up to 8 kV pass through the objective lens, and thereby the blur due to chromatic aberration is reduced to one sixteenth. The use of the electron source 1 according to the present invention herein gives a desired angular current density (about 50 μA/sr) at Vs of −0.3 to −0.7 kV and V1 of 2.5 to 3 kV. In this case, the extraction electrode 11 has a potential of V0+V1 of −0.5 to 0 V, which potential is an identical potential or a slightly negative potential to the ground potential of a second anode 13. A first anode 12 arranged between the two electrodes controls a lens action which occurs when the difference in potential between the two electrodes is large. In particular, when the extraction electrode 11 has a positive potential and the electron should be significantly retarded in the vicinity of the second anode, the retarding field causes large aberration. In addition, the retardation causes the electron beam emitted from the electron source 1 to have low brightness. Accordingly, the ultimate resolution deteriorates with an increasing retardation. This influence may not be avoided at any potential of the first anode 12, and the potential V0+V1 of the extraction electrode is preferably zero or negative (minus).

This leads to a condition that the extraction voltage V1 has an absolute value equal to or less than the absolute value of the acceleration voltage. Based on this, the practical upper limit of V1 is preferably 3 kV for the high resolution at low acceleration mode.

In the X-ray element analysis mode, the necessary time has precedence over the resolution in may cases. This is because X rays are generated in a smaller quantity as compared to the case of SEM in which secondary electrons and reflected electrons are obtained on the order of equivalent amount to that of the probe electron beam 14, and a high-speed analysis is possible by measuring these electrons at a high sensitivity. In the X-ray element analysis mode, therefore, the probe electron beam 14 is preferably applied in an amount as much as possible as compared to that in the high resolution observation. For an element analysis at a relatively high resolution, the electron energy incident to the sample is set to be low, e.g., 4 kV, and the energy distribution of generated X rays is measured with an X-ray analyzer 21 at a resolution of about 3 nm. In this case, the retarding is unnecessary, and Vs is 0 V and V0 may be set to be −4 kV, and the sample incident energy is 4 kV. For the same reason as above, V1 is preferably 4 kV or less to obtain maximum effects. Particularly when a large current is required, V1 is preferably 4 kV or less, because the probe current is V0/V1 times the density J0 (A/sr) of angular current emitted from the electron source 1, and a desired angular current density is preferably obtained with minimum V1.

Figure 5:
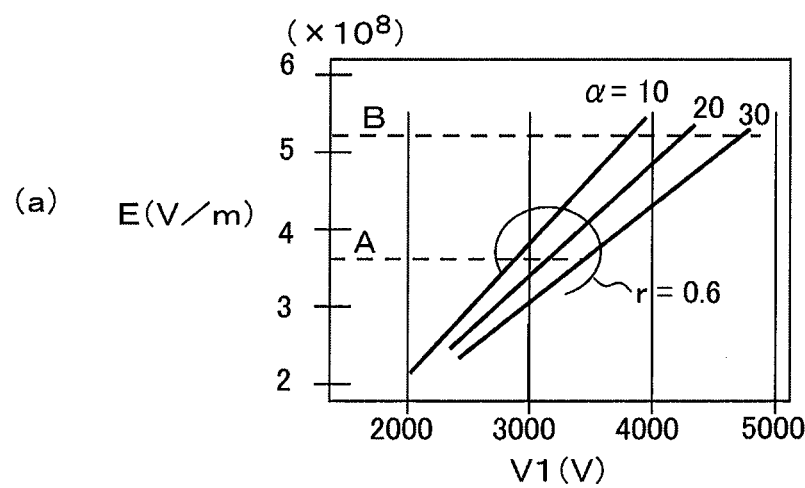
FIG. 5 depicts views (a) and (b) illustrating an experimental example of the present invention.
Figure 5:
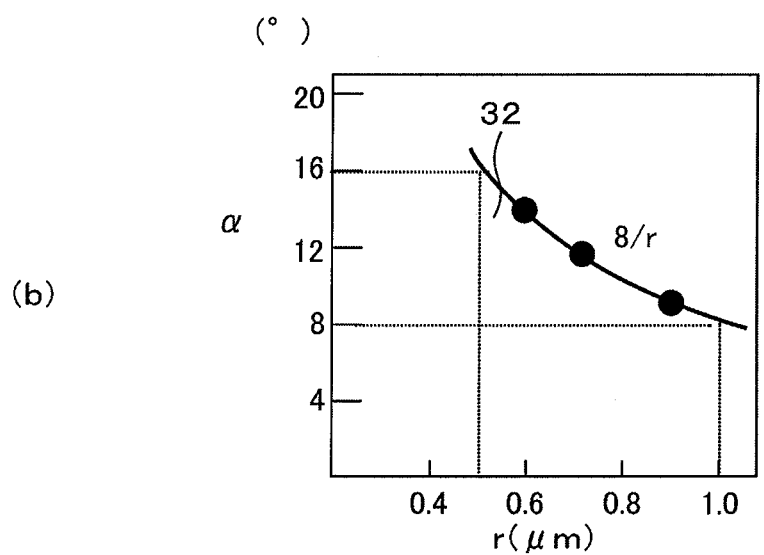

The above condition corresponds to such a condition that a surface electric field E is obtained at a V1 of desired value or less, which surface electric field decides the current density emitted at the tip of the electron source. FIG. 5(a) depicts exemplary relationships between the surface electric field E and the extraction voltage V1, in which r is set at 0.6 μm. The extraction voltage V1 is a value used in the apparatus illustrated in FIG. 2. The horizontal dashed lines A and B herein represent electric fields required for the high resolution at low acceleration mode and for the high speed element analysis mode, respectively. Of the plotted lines, the line at α of 10° meets the condition for V1, namely, 3 kV or less for the line A and 4 kV or less for the line B. Conditions corresponding to the lines at cone angles α of 20° and 30° are not suitable, because the extraction voltage becomes higher than necessary.

In consideration in more detail, α is approximately less than 13.4 degrees to meet the above condition when r is 0.6 μm. FIG. 5(b) is a graph of the boundary values as plotted at different radii r of curvature, and the graph gives an approximate expression of α=8/r, in which r is in units of micrometers (μm) and α is in units of degrees) (°). The graph is a curve as in the figure, because the electric field varies with a varying radius r of curvature of the tip. As read from the curve, a suitable condition for use is approximately the condition of α<(8/r) at r of from 0.5 to 1.0 μm.

Next, a so-called large current observation typically in the high speed element analysis mode in which the electron source emits a large quantity of electrons will be described. In this case, factors which limit the resolution include a phenomenon in which the energy width and electron source size become large with an increasing current density.

Figure 3:
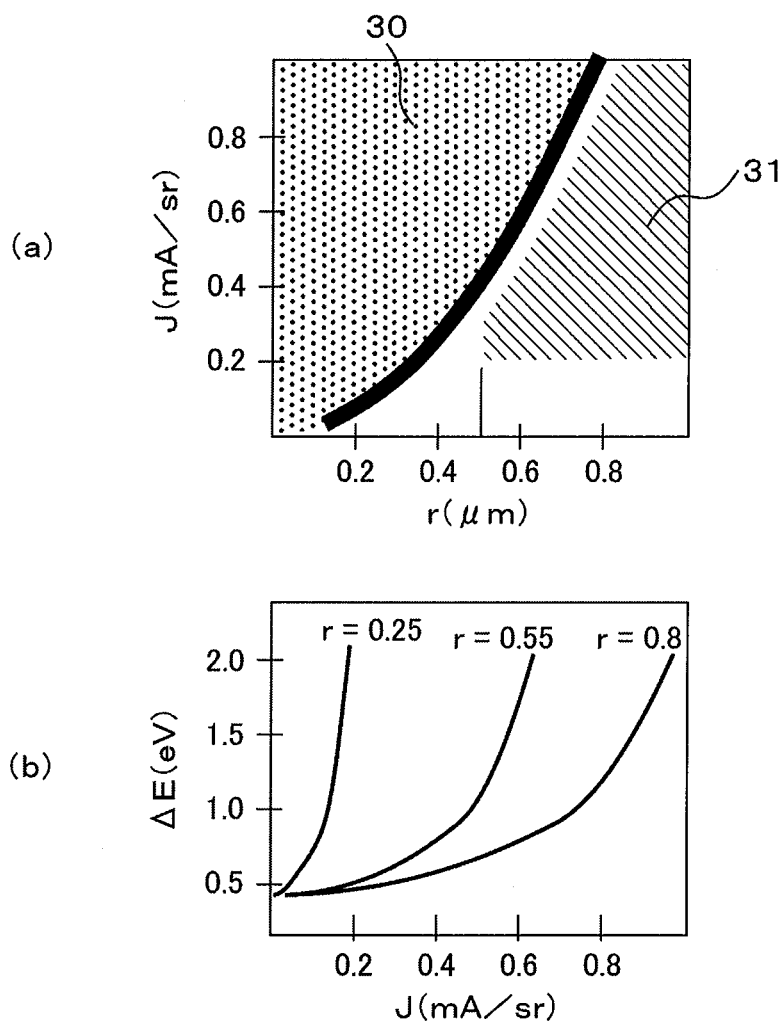
FIG. 3 depicts views (a) and (b) illustrating an experimental example of the present invention.

There is a phenomenon in which the energy width and electron source size become very large due to repulsion through Coulomb interaction at a certain current density or more, because electrons emitted from the electron source have low initial velocities. This phenomenon is called space charge effect or Boersch effect and occurs more significantly at a smaller current with a decreasing radius r of curvature of the tip, because the emission source area decreases with such a decreasing radius r of curvature of the tip. A current quantity per unit cubangle, i.e., angular current density J (A/sr) is used herein as a parameter for the current from the electron source. An index for brightness herein is a value obtained by dividing the angular current density J by the electron source size S ($m^2$). A value (J/S/V0) obtained by dividing J/S by the acceleration voltage V0 may be used as "reduced brightness," because the value J/S is in proportional to the acceleration voltage. With an increasing radius r of curvature of the tip, the electron source size S increases in proportional approximately to $r^2$, and the angular current density J should be increased in proportional to $r^2$, if an identical brightness is to be obtained. A boundary at which the effect becomes significant is shown by the solid line in FIG. 3(a). An upper-left region from the boundary, i.e., a space charge dominant region 30 as dotted is apparently an undesirable region in which the space charge effect is dominant. The solid line in FIG. 3(a) is determined in the following manner. Typically, in an SE electron source having a radius r of curvature of the tip of 0.25 μm, the space charge effect becomes significant and causes problems at J of about 0.1 mA/sr or more. For example, the resolution becomes low and the probe current fails to become large because of increased energy width and increased electron source size. FIG. 3(b) is a graph of the energy width (full width at half maximum (FWHM)) E of the electron beam as plotted against the angular current density J at different radii r of curvature of the tip, i.e., r of 0.25 μm, as well as r of 0.55 μm, and r of 0.8 μm. When the energy width E becomes larger than about 1 eV, the space charge shows a significant effect to cause the energy width and the electron source size to become large rapidly, and the parameters J and r at this time point are plotted as the boundary line in FIG. 3(a). In practice, detection through high-speed energy dispersive X-ray analysis (EDX) and pattern inspection require an angular current density of the probe current of 0.2 mA/sr or more; and the space charge effect becomes significant under this condition. The apparatus may be preferably used at a current density of 90% or less of the region as above. To utilize the region at J of 0.2 to 0.3 mA/sr, the radius r of curvature is preferably more than 0.5 μm. When a larger current is required, the parameter may be selected within a hatched region in FIG. 3(a), i.e., a region 31 where space charge has a small effect. Accordingly, the radius r of curvature is preferably more than 0.5 μm.

Next, the case where the radius r of curvature is large will be described. Under conditions where the space charge has no effect, the energy width of electron beams from the SE electron source at an identical surface electric field E is basically constant even at different radii r of curvature. Likewise, the current density is constant in this case. Properties of the electron source which vary depending on the radius r of curvature include the emission source area, in addition to the extraction voltage V1.

When the probe current of the SEM is limited by the angular current density J, the SEM is used in practice with an increasing reduction rate, because the angular current density J increases approximately in proportional to the emission source area, but the electron source size also increases in the same manner. As a result, the probe current decreases with reduction in the electrooptic system, and an approximately identical probe current is obtained even at different radii r of curvature when the surface electric field E is identical.

Under such conditions, however, the power supply requires more severe performance. Typically, to obtain a probe current equivalent to that at an angular current density J of 0.2 mA/sr at r of 0.3 μm and α of 10°, an angular current density J of 1.8 mA/sr is necessary at r of 1 μm and α of 30°. In this case, the extraction voltage should be 7 kV or more, and a total of about 1 mA of emitted current passes. Under such high voltage and large current conditions, the power supply requires further higher stability, and this causes very high cost of the power supply. In addition, energy consumption increases, thus being undesirable to society.

When the probe current and resolution of the SEM are limited by the brightness, the brightness is in proportional to the acceleration voltage $V0$ and is in inversely proportional to the extraction voltage $V1$ even at an identical electric field. This case provides a significant issue for the application of the high resolution at low acceleration voltages where the brightness severely affects. In this case, a sufficient brightness is not obtained under customary conditions of r of 1 μm or more, but a satisfactory brightness is obtained under conditions of r of less than 1 μm.

If the cone angle α of the electron source tip is 5° or less, the tapered tip portion becomes excessively long when the tip portion is formed so that the diameter thereof continuously varies as illustrated in FIG. 1(b). With reference to FIG. 1(c), electrons emitted from the tungsten (100) plane in the needle-shaped tip are used. Equivalent planes are formed in directions perpendicular to the (100) plane, and these give tetragonal emission patterns around the central beam. The planes in perpendicular directions are four planes in total, as (010) and (001) planes and opposite planes thereto. If these planes have significantly larger areas than that of the tip (100) plane, a flare contaminates the probe electron beam 14 used typically in the apparatus illustrated in FIG. 2, and this impedes focusing of the beam into a fine one. The area of the planes in the side of the tip region varies depending on the cone angle α and increases with a decreasing α, because the (010) and (001) planes elongate long.

For these reasons, the cone angle α is preferably more than 5° so as to suppress flare.

Figure 4:
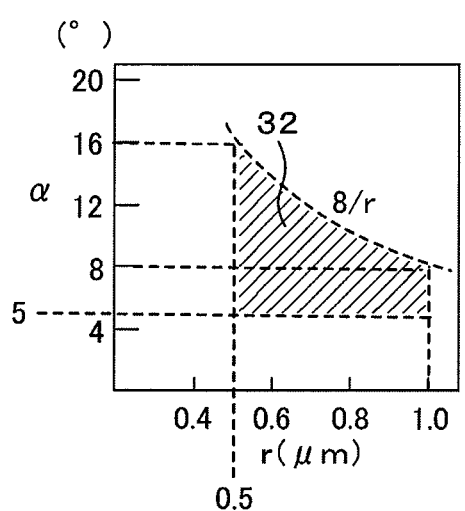
FIG. 4 is a view illustrating an experimental example of the present invention.

Based on the above discussion, it is preferred that the radius r of curvature is more than 0.5 μm and less than 1 μm and the cone angle α is more than 5° and less than $(8/r)°$, for obtaining both the functions of high resolution at low acceleration voltage and elemental analysis at high speed. Such preferred conditions are shown as a preferred condition region 32 in FIG. 4.

More preferably, the cone angle α is 8° to 11° and the radius r of curvature is 0.55 to 0.65 μm. Under this condition, the apparatus shows good reproducibility, can be used at an angular current density of 0.4 mA/sr, and can be used both in high-speed energy dispersive X-ray analysis (EDX) and in observation with a high resolution of 1.2 nm even at a low acceleration voltage of about 800 eV. The latter function can be achieved by reducing the angular current density to less than 30 μA/sr and setting the energy width (E) to 0.4 eV. Specifically, both the observation with high resolution at low acceleration voltage and the high-speed analysis can be achieved by a single electron beam apparatus.

The electron source tip may be prepared typically in the following manner. A single-crystal tungsten rod 7 is electrolytically etched to form a needle-shaped tip, and the tip is rounded by heating under vacuum to give a desired shape. In a most representative process, the single-crystal tungsten rod 7 is immersed in an aqueous solution of about 1 mol/L NaOH or KOH, a current is allowed to pass therethrough for electrolytically etching a portion of the rod in the aqueous solution, and the etching is stopped at a suitable point to remain a needle-like shape. A direct current, when used in the electrolytic etching, gives a tip region with such a shape as to have a decreasing cone angle toward the tip as illustrated in FIG. 1(b) and is advantageous for the preparation of a tip with a small cone angle α.

Figure 6:
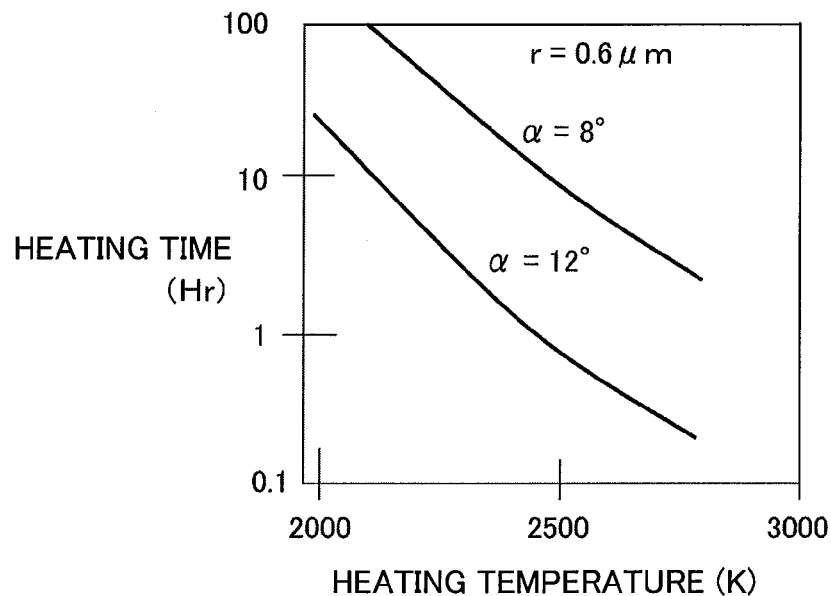
FIG. 6 depicts a view illustrating an experimental example of the present invention.

In contrast, an alternating current, when used in the electrolytic etching, gives a conical portion with a substantially constant cone angle and is advantageous for the formation of a region with a large cone angle α of from 12° to 16°. In addition, a tip with desired cone angle α may be obtained by forming a region with a small cone angle α by using a direct current, and then slightly polishing the surface using an alternating current. The radius r of curvature of the tip is determined by heating conditions and the cone angle α. Examples of these conditions and parameter are shown in FIG. 6. Typically, at a cone angle α of 12°, a region with a radius r of curvature of 0.6 μm may be formed by heating at 2000 K for about 20 hours. Such a region may be formed within a shorter time at a higher temperature. At a smaller cone angle α of 8°, the region may be formed by heating at 2300 K for about 20 hours. Optimal conditions should be established for obtaining a desired cone angle α, because the cone angle α also increases by about 5% to about 20% after heating, due to migration of tungsten atoms. Thus, for rounding the tip due to migration of tungsten atoms through heating, heating at a higher temperature for a longer time is required for migration of tungsten atoms in a larger amount.

For a further higher heating temperature to achieve a further shorter process time, the heating may be performed in $H_2$ gas or a halogen gas such as $F_2$ or $Cl_2$ gas at a higher temperature, because evaporation of tungsten can be suppressed in such gas. The heating of the tip may be performed by arranging another electron source instead of the filaments and applying electrons emitted from the other electron source to the tungsten needle. The heating may also be performed by collecting light instead of electrons. This heating may be performed by forming an optical system using lenses and/or collection mirrors so that light comes into a focus in the vicinity of the needle-shaped tip in a vacuum.

Figure 7:
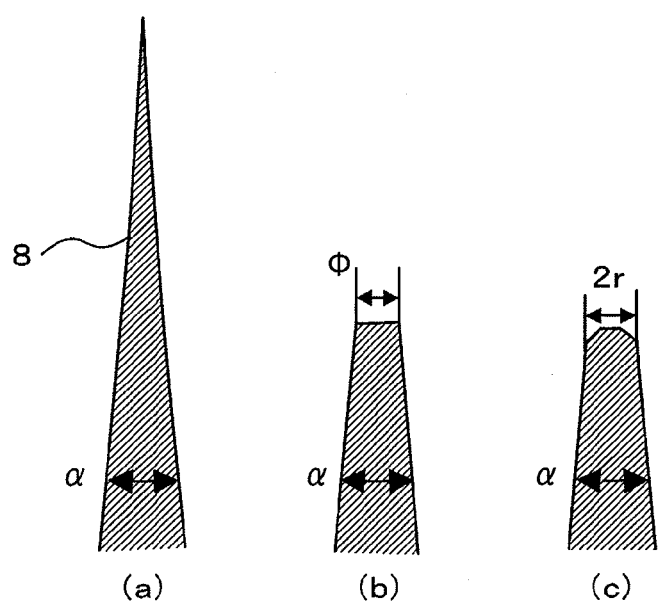
FIG. 7 depicts views (a), (b), and (c) illustrating an embodiment of the present invention.

For forming the tip region highly precisely within a short time, migration of tungsten atoms may be reduced in quantity by removing a needle-shaped tip region with a small radius r of curvature typically with a focused ion beam (FIB), which needle-shaped tip region has been formed typically through electrolytic etching. An example of this technique is shown in FIG. 7. The cone angle α of the needle is a value determined at a position where the cross sectional diameter φ of the tip 8 is about 2 times the required r, and etching conditions for forming the needle illustrated in FIG. 7(a) should be determined as such.

Next, the needle formed by etching is placed in an ion beam processor using focused Ga+, which is widely used as ion beams, and Ga+ ion beams in a uniform direction are applied to the needle in a direction perpendicular to the needle axis to thereby cut off the tip. The cutting is stopped at a portion where the tip has a diameter of φ. The tip region is then heated in a vacuum to allow the tip to have a radius r of curvature. At a radius r of curvature of 0.6 μm and a cone angle α of 10°, the diameter φ may be set to 1.0 to 1.1 μm. The heating may be performed typically at a temperature of 1800 K for about 1 hour, or at a temperature of 2100 K for about 5 minutes. The FIB process permits a smoothness of the plane of about ±0.2 μm and a deviation in angle from the (100) plane of about ±5°, because, even if the tip region before heating has some unevenness, the tip region takes a crystallographically stable structure through subsequent heating. The above process is suitable for mass production, because the process can be performed within a short heating time with a high dimensional precision.

Although the tungsten rod immediately after etching is subjected to FIB processing in the above process, the FIB processing is also effective even after the Zr—O diffusion source is attached to the rod (needle) as an electron source as illustrated in FIG. 1(a). In this case, the work to be processed may be placed in the FIB processor with the suppressor as intact or after detaching the suppressor. The heating under vacuum for obtaining a desired r can be performed before or after electron emission as being placed in the electron gun, and, in this case, an extra step of heating under vacuum may be saved.

Any ions other than Ga ion may be used as the ion species, as long as having an etching action. For example, another ion such as oxygen ion or argon ion will also do in the process.

The SEM according to this embodiment uses the EDX analyzer as an X-ray detector, but may also use, instead of the EDX analyzer, a wavelength dispersive X-ray (WDX) analyzer which measures wavelength dispersion. The SEM also uses electrons at a low acceleration voltage of 4 kV, but may use electron beams at an incident energy of from about 3 kV to about 15 kV, as long as signals can be detected. At a high electron energy, detection with high precision in a short time can be performed because of increased X-ray signals.

Embodiment 2

Figure 8:
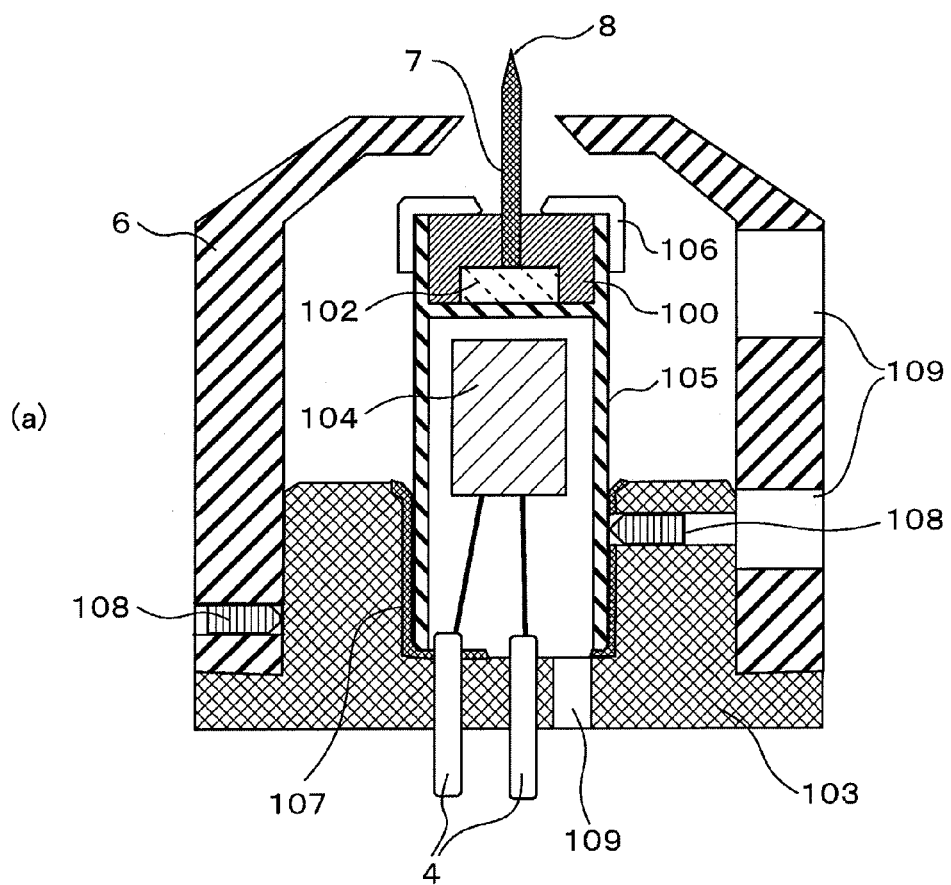
FIG. 8 depicts views (a), (b), and (c) illustrating an embodiment of the present invention.
Figure 8:
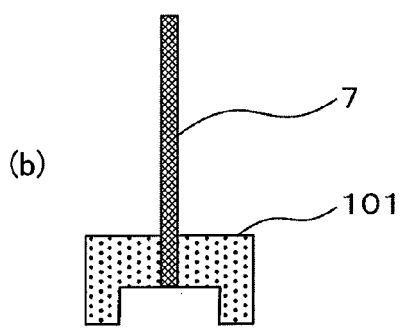
Figure 8:
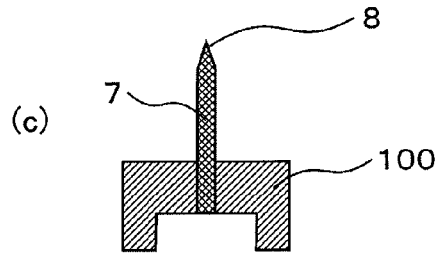

FIG. 8(a) shows an electron source according to another embodiment of the present invention. A portion which emits electrons is a needle-shaped tip 8 arranged at the tip of a single-crystal tungsten rod 7. By energizing a tungsten filament heater 104 for heating, an oxide containing Ba—O migrates from a diffusion source 102 and is impregnated into a metal sintered body 100. These components are housed in a cathode support tube 105, over which a cathode cap 106 is installed both to prevent the metal sintered body 100 from dropping off and to control the oxygen partial pressure. The metal sintered body 100 contains tungsten as a principal component, and barium and oxygen atoms, which are formed through reduction by tungsten, diffuse through the surface of the single-crystal tungsten rod and form a low-work-function surface of Ba—O—W at the needle-shaped tip 8, from which electron beams are emitted. Power is supplied to the heater 104 via two electrodes 4.

To supply a current emitted from the needle-shaped tip 8 of the electron source, one of the electrodes 4 is electrically connected to the metallic cathode support tube 105 via a metal film 107 applied on a cathode insulator 103.

This yields an electrical contact up to the needle-shaped tip 8. The electron source is preferably operated at a temperature of the tip 8 of from 800 K to 1200 K. The electron source is more preferably operated at a tip temperature of from 1000 K to 1100 K so that the electron source has both satisfactory monochromaticity and good stability. The operating temperature may be checked externally with a radiation thermometer (pyrometer) through one of holes 109 opened in part of a suppressor 6.

Alternatively, a thermocouple may be arranged inside the apparatus. The current, voltage, or power consumption of the heater 104 is controlled, for obtaining a desired temperature as the measured temperature.

The suppressor electrode 6 is arranged to suppress thermal electrons from emitting from the surface of the metal sintered body 100 and is fixed via the cathode insulator 103 to the cathode support tube 105 by the action of a locking screw 108. The diffusion source 102 outlives its usefulness at the time when it becomes incapable of supplying barium. For extending the lifetime of the diffusion source, it is effective to design the diffusion source 102 to have a large capacity and to prevent barium from evaporation into a vacuum. The electron source having such a structure according to the present invention has a lifetime of the diffusion source of 5 years or longer even when the diffusion source continuously emits electrons with continuous energization. This is because the cathode support tube 105 and the metal sintered body 100 serve as a coverage so as to prevent the evaporation, and the diffusion source can have a desired capacity as suitably designed.

When only an oxide containing Ba—O is used as a diffusion supply source according to the known techniques, the oxide, when placed in the air, absorbs moisture to be converted into BaOH, and this invites deterioration in characteristic properties of the electron source. The electron source having such a structure as above, however, can be handled without deterioration, because the deterioration is retarded by covering the diffusion source 102 with the metal sintered body 100. Typically, the electron source may be stored without deterioration over one year or longer by sealing the electron source in dry nitrogen during storage. Upon actual use, the sealed electron source is unsealed and recovered into the air. The resulting electron source does not suffer from deterioration even after operation in the air for 1 to 2 hours. In addition, the electron source may be used over about 1 year even after once used as an electron source, then stored, and recovered into the air by storing the electron source in an atmosphere containing no moisture, such as dry nitrogen.

The metal sintered body 100 may be prepared typically in the following manner.

With reference to FIG. 8(b), a metal powder compact 101 is arranged at one end of single-crystal tungsten <100> rod 7. The metal powder compact 101 is formed by molding a tungsten powder (average grain size of 0.5 to 3 μm) in a mold at one end of the single-crystal tungsten rod. The tungsten powder may further contain a higher alcohol such as isostearyl alcohol as a binder in an amount of about 1%. The single-crystal tungsten rod has a diameter of about 0.13 mm, and the molded tungsten powder has a diameter of from about 0.5 to about 5 mm and a height of from 0.5 to 5 mm. This article is calcined at a temperature of 1000 K or higher in an atmosphere of hydrogen or in a vacuum to evaporate the binder and then sintered by heating at a temperature of about 2000 K±200 K for a duration of from 5 minutes to 1 hour. Alternatively, the molded metal powder may be subjected merely to calcination at a temperature of 1000 K or higher. This gives the combination of the single-crystal rod 7 and the metal sintered body 100, and thereafter a needle-shaped, sharpened tip 8 is formed through electrolytic etching using a sodium hydroxide (NaOH) aqueous solution or a potassium hydroxide (KOH) aqueous solution (FIG. 8(c)).

Next, the molded tungsten powder is sintered by heating at a temperature of about 2000 K±200 K in a vacuum for a duration of from about 5 minutes to about 1 hour and thereby yields a sintered compact. The sintering process controls the porosity of the tungsten sintered compact and the radius of curvature of the needle-shaped tungsten <100> tip, and conditions for the sintering process are chosen so that these parameters reach desired values. It is important to control the grain size of the powder and the cone angle of the needle-shaped tip in advance so that heating at a single temperature for a single time (duration) provides a desired porosity and a desired radius of curvature. The metal sintered body 100 is porous and preferably has a porosity of from about 1% to about 20%.

The material metal may further contain another metal such as nickel (Ni). Alternatively, it is not necessary to use tungsten as a principal component, and nickel, for example, may be used as the principal component in the form typically of an alloy containing other elements such as magnesium (Mg) and/or silicon (Si) in an amount of from 0.05% to 0.25%.

The diffusion source 102 mainly contains a mixture of BaO, CaO, and SrO. These oxides may be prepared by previously molding powders of barium carbonate, calcium carbonate, and strontium carbonate, and heating the molded article to 1000 K or higher to thermally decompose the carbonates into oxides. In this process, the addition of a binder may improve formability. For example, an alcohol or ether solution of collodion may be added in an amount of from about 1% to about 10%. Once the materials are converted into oxides, the oxides should be stored in dry air or nitrogen, or in a vacuum so as to avoid deterioration due to absorption of moisture from the atmosphere. Independently, it is also possible that the carbonates are attached as intact as an electron source material, and then decomposed into oxides through heating, and used in site as the electron source without detachment.

The diffusion source is not limited to such oxides but can also be barium chromate ($BaCrO_4$), barium manganate ($BaMnO_4$), or another compound that liberates barium through heating or a reductive reaction. If a material containing barium oxide, when used for the diffusion source, generates excess free oxygen upon the liberation of barium through thermal decomposition, the operation of the electron source may be impeded. To avoid this, the material may further contain particles of a getter material. As used herein the term "getter material" refers to a material which adsorb oxygen and hydrogen and which is an alloy containing Zr and/or Ti as a principal component. The metal (alloy) containing Zr or Ti as a principal component may be used in the sintered metal 100.

Figure 9:
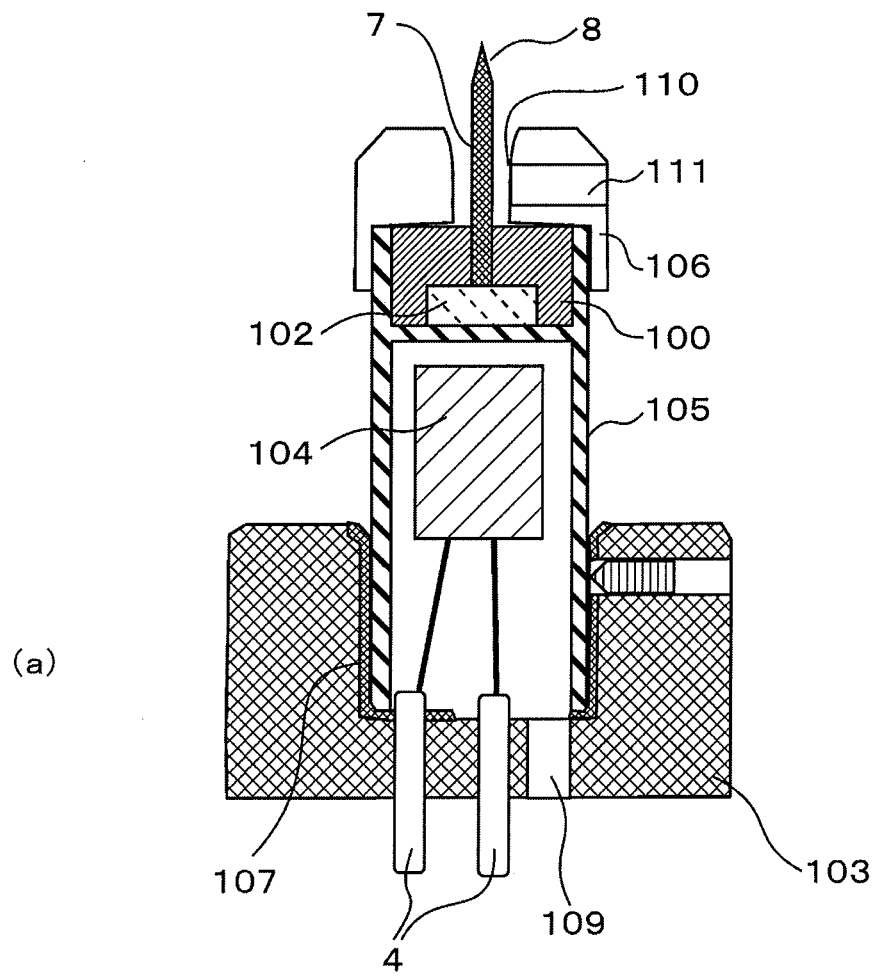
FIG. 9 depicts views (a) and (b) illustrating an embodiment of the present invention.
Figure 9:
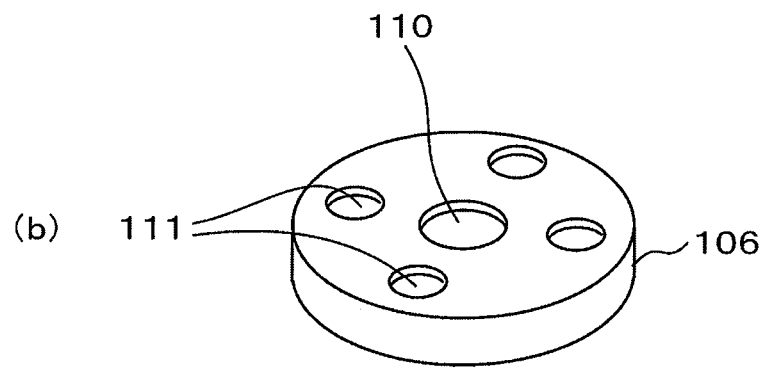

The electron source according to this embodiment employs the suppressor electrode as a structure for preventing generation of excess thermal electrons. However, the structure is not limited thereto and may be one which has an electron potential higher than the energy of thermal electrons emitted from the surface of the sintered metal (metal sintered body) 100. Typically, the cathode cap 106 may be configured to be long as illustrated in FIG. 9(a). In this case, Ni, Ni—Cr alloy, or Fe—Ni—Cr alloy is preferably used as a material around a centre hole 110 of the cathode. This is because these metals have work functions of from 4.5 to 5 eV, electrons emitted from the central part of the tungsten surface having a lowered work function of 2.0 eV or less each have an energy lower than the vacuum level of the hole in the cathode cap 106 by 2 eV or more, and the electrons are thereby pushed back to a portion having a lower potential. It is necessary that the opening of the centre hole 110 is sufficiently narrow as compared to the length of the hole.

Gas-vent holes 111 may be arranged in the cathode cap 106 as illustrated in FIG. 9(b) so as to discharge the emission gas from the barium diffusion source 102 and the sintered metal 100 to the outside immediately.

The electron source according to this embodiment can be used, instead of a customary Schottky electron source using ZrO, at an energy width of from 0.2 to 0.3 eV, approximately one half to one third that of the customary Schottky electron source. The electron source, typically when used as the electron source 1 in the drawings relating to Embodiment 1, can reduce chromatic aberration and allows the apparatus to have a high resolution. The apparatus may have a resolution of about 0.8 nm at a sample incident energy of 1 kV. The apparatus also advantageously performs X-ray analysis in a shorter time than that of customary equivalents, because the electron source has a lower work function and thereby emits a larger current at a lower electric field that is applied to the surface of the electron source than those of the customary equivalents. The electron source according to this embodiment, when used in an electrooptic system in which electrons are used as retarded to have lower energy, allows the electrooptic system to have further higher performance, because the electron source has an energy width of 0.2 eV and thereby has monochromaticity better than that of a field emission (FE) electron source using tungsten <310>. The electron source, when applied typically to low energy electron microscopes (LEEM) and mirror electron microscopes, allows these apparatuses not only to have a higher resolution but also to perform a higher speed observation at an identical resolution, because of increased quantity of image signals.

According to Embodiment 2, it is effective to design the electron source tip region to have a radius r of curvature of more than 0.5 μm and less than 1 μm and a cone angle α of more than 5° and less than (8/r)° as in Embodiment 1, but it is also effective to design the electron source tip region to have a radius r of curvature of up to about 3 μm and a cone angle α of up to 30°, because the electron source has a low work function and thereby requires merely a small electric field.

When high resolution performance due to excellent monochromaticity is required without needing a large current, the electron source tip region preferably has a smaller radius r of curvature of typically from 0.2 to 0.5 μm at a smaller cone angle α of from 5° to 10°, and this allows a high brightness monochromatic electron source to exhibit highest performance.

Figure 10:
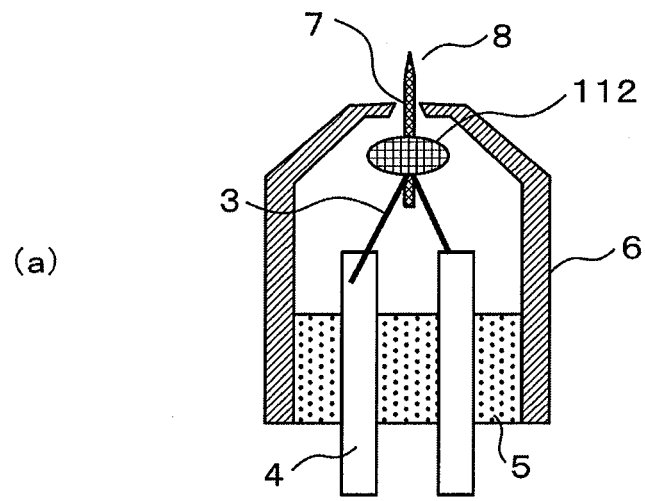
FIG. 10 depicts views (a), (b), and (c) illustrating embodiments of the present invention.
Figure 10:
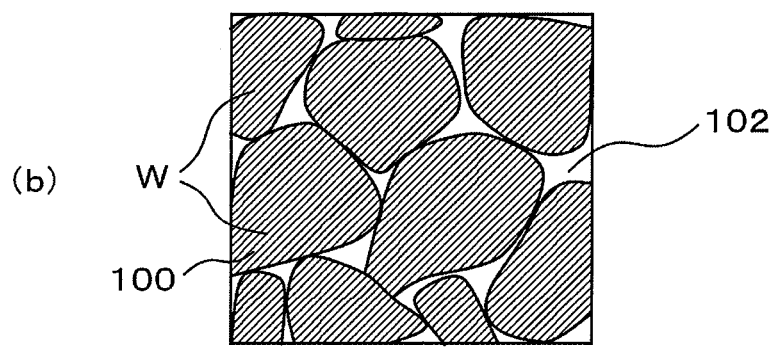
Figure 10:
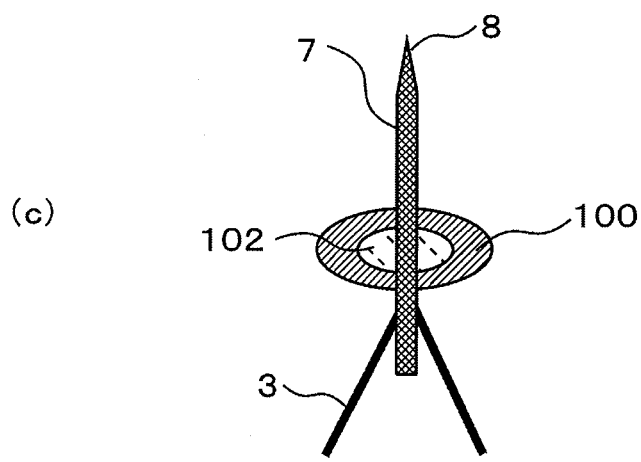

In this embodiment, the sintered metal 100 and the diffusion source 102 are separately or independently arranged as the diffusion supply source. However, these members may be prepared as an integral one member. Typically, with reference to FIGS. 10(a) and (b), a barium reservoir 112 may be provided in a part of the single-crystal tungsten rod 7, which barium reservoir has been prepared by impregnating the sintered metal 100 with an oxide containing Ba—O as the barium diffusion source 102 so that the oxide is present between grains of the sintered metal. The electron source in this case can have a simple structure as in FIG. 10(a) and thereby has advantages of smaller number of components, smaller size, and lower cost. In another embodiment, the barium reservoir may be one prepared by covering the barium diffusion source 102 with the sintered metal 100 as illustrated in FIG. 10(c).

The electron source according to Embodiment 2 uses one heating means for heating the tungsten needle 1 serving as an electron emission source and for heating the diffusion supply source, but the electron source may have two or more heating means typically as illustrated in FIG. 11(a). This electron source includes three electrodes 4, namely, electrodes F1, F2, and F3, in which one pair (F1 and F2) of these electrodes are connected to the tungsten heater 3 for heating the tungsten needle 1, and another pair of them (F2 and F3) are connected to the reservoir heating means 113 for heating the barium reservoir 112. The barium reservoir for use herein may for example be one prepared by impregnating the sintered metal 100 with an oxide containing Ba—O as the barium diffusion source 102 so that the oxide is present between grains of the sintered metal. The reservoir heating means 113 herein is tungsten filaments, and the sintered metal 100 is fixed to the electrodes 4 by spot welding.

In an exemplary circuit diagram illustrated in FIG. 11(b), a current If is passed for heating the tungsten heater 3; and a current Id is independently passed for heating the reservoir heating means 113. A constant current (CC) circuit is used herein, but any circuit, such as a constant voltage circuit or constant power circuit, will do, as long as heating to a desired temperature can be achieved. In this process, the barium reservoir 112 is heated to a temperature of from 1200 K to 1500 K to evaporate barium and oxygen to thereby allow them to adsorb on the surface of the tungsten needle 1. The heating temperature can be checked based on the quantity or color of light emitted via a lateral hole 109 of the suppressor 6.

Independently, the tungsten needle 1 is held to a temperature of from 900 K to 1100 K and thereby emits electrons. In this case, it can be operated as an electron source under optimum temperature conditions for the two components and advantageously stably emits electrons monochromatically at high brightness. If the electron emission becomes lower or becomes unstable due to contamination of the surface of the tungsten needle 1 caused typically by coverage of carbon, the contaminated surface can be cleaned by temporarily increasing only the current passing through the tungsten heater 3 and thereby heating the tungsten needle 1 to a temperature of from about 1800 K to about 2200 K. In this process, Ba—O at the surface of the tungsten needle 1 is lost by evaporation, but Ba—O is still continuously supplied because the reservoir heating means 113 is not raised in temperature; and the electron emission can be restarted by allowing the temperature of the tungsten needle 1 to be decreased to the operating temperature.

Figure 11:
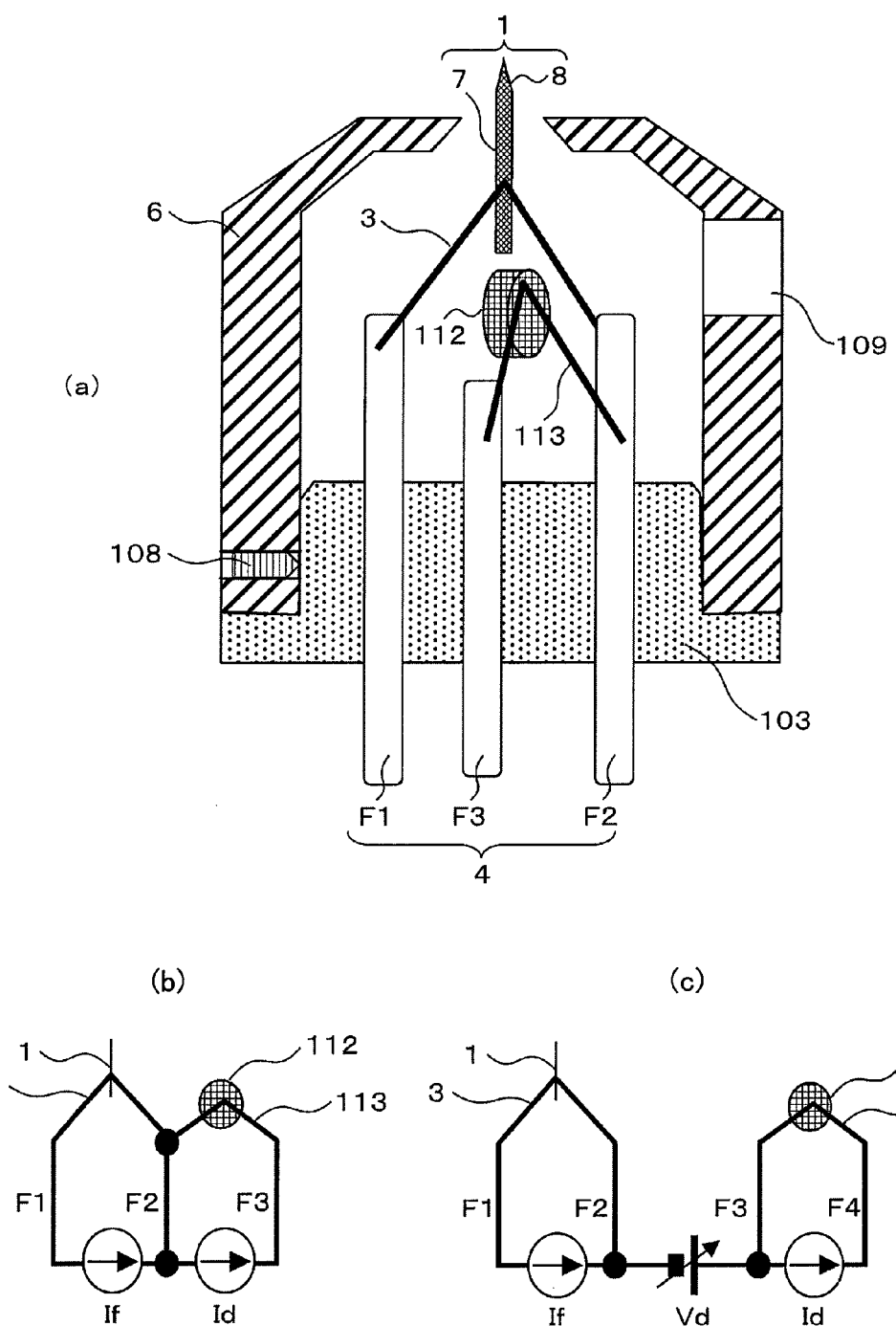
FIG. 11 depicts views (a), (b), and (c) illustrating embodiments of the present invention.

As illustrated in another exemplary circuit diagram in FIG. 11(c), the electron source may have a structure in which four electrodes 4, i.e., electrodes F1, F2, F3, and F4 are arranged, the reservoir heating means 113 is connected to a pair of the electrodes F3 and F4, and a voltage Vd is applied between the electrodes F2 and F3. This configuration gives further stable electron emission by adjusting Vd in the range of from about +10 to about +300 V so as to allow the reservoir heating means 113 to have a potential more positive than that of the tungsten needle 1, because this prevents thermal electrons from migrating into the tungsten needle 1 and the tungsten heater 3, which thermal electrons are emitted from the reservoir heating means 113. The configuration also shows an advantage upon cleaning of the tungsten needle 1. Specifically, by adjusting Vd in the range of from about −100 V to about −500 V so as to allow the reservoir heating means 113 to have a potential more negative than that of the tungsten needle 1, thermal electrons emitted from the reservoir heating means 113 or barium reservoir can be used for heating the tungsten needle 1 for cleaning. The electron source in FIG. 11 employs a reservoir heating means 113 which has been prepared by impregnating the sintered metal 100 with an oxide containing Ba—O as the barium diffusion source 102 so that the oxide is present between grains of the sintered metal, but the barium reservoir 112 is not limited, as long as barium and oxygen can evaporate through heating, and a barium reservoir 112 including a sintered metal 100, a diffusion source 102, and a cathode support tube 105 as in FIG. 8(a), for example, will also do.

INDUSTRIAL APPLICABILITY

As has been described above with reference to several embodiments, the present invention can give electron sources suitable for electron beam apparatuses which have a high resolution at low acceleration voltage and enable elemental analysis at high speed. Accordingly, the present invention may provide high-resolution and multifunctional SEMs and charged particle beam apparatuses.

REFERENCE SIGNS LIST 1 tungsten needle
2 Zr—O diffusion source
3 tungsten heater
4 electrode
5 insulator
6 suppressor
7 single-crystal tungsten rod
8 needle-shaped tip
9 approximated conical portion
10 electron source
11 extraction electrode
12 first anode
13 second anode
14 probe electron beam
15 condenser lens
16 electron detector
17 ExB deflector
18 detection electron
19 deflector
20 booster electrode
21 X-ray analyzer
22 vacuum vessel
23 objective lens
24 sample
25 sample stage
26 electron gun power supply
27 power supply
28 controller
30 space charge dominant region
31 region where space charge has small effect
32 optimum region
100 sintered metal
101 metal powder compact
102 diffusion source
103 cathode insulator
104 heater
105 cathode support tube
106 cathode cap
107 metal film
108 locking screw
109 hole
110 centre hole
111 gas-vent hole
112 barium reservoir
113 reservoir heating means

The invention claimed is:

1. An electron beam apparatus comprising a Schottky emission electron source, the electron source including a single-crystal tungsten metal needle as an electron emission source; a zirconium-oxygen (Zr—O) diffusion source; a heater; and a suppressor electrode,
wherein the electron beam apparatus provides an extraction electrode applying an extraction voltage for extracting an electron from the Schottky emission electron source,
wherein the single-crystal tungsten metal needle is shaped to have a cylindrical portion; a constricted portion arranged on and extending from the top of the cylindrical portion and having a tapered shape; and an approximately conical portion extending from the constricted portion,
wherein, when the tip of the conical portion which emits electrons is assumed to be a semi-sphere having a radius of curvature of r, the radius r of curvature of the tip is more than 0.5 μm and less than 1 μm,
wherein the conical portion has a cone angle of α of more than 5° and less than (8/r)°, wherein the cone angle is an opening angle of a cone constituting the conical portion, and wherein r is indicated in units of micrometers (µm)), and wherein the extraction voltage is from 2.5 kV to 3 kV when a voltage applied to the suppressor electrode is set to be −0.3 kV to −0.7 kV.

2. The electron beam apparatus according to claim 1, wherein the single-crystal tungsten metal needle has a length of Ln from the tip of the conical portion to the boundary between the cylindrical portion and the constricted portion, and wherein the length Ln is less than 200 µm.

3. An electron beam application apparatus comprising:
an electron source that emits electron beams;
a deflector that deflects the emitted electron beams;
an irradiator that irradiates a sample with the electron beams; and
at least one of an electron detector and an X-ray detector, where the electron detector detects electrons emitted from the sample, and the X-ray detector detects X-rays emitted from the sample,
wherein the electron source comprises the electron beam apparatus according to claim 1.

4. The electron beam application apparatus according to claim 3, wherein the electron beam application apparatus comprises both the electron detector and the X-ray detector, and
wherein the X-ray detector has the function of classifying emitted electron beams by the wavelength or energy.

5. An electron beam apparatus comprising a Schottky emission electron source including a single-crystal tungsten metal needle as an electron emission source; a zirconium-oxygen (Zr—O) diffusion source; a heater; and a suppressor electrode,
wherein the single-crystal tungsten metal needle is shaped to have a cylindrical portion; a constricted portion arranged on and extending from the top of the cylindrical portion and having a tapered shape; and an approximately conical portion extending from the constricted portion,
wherein, when the tip of the conical portion which emits electrons is assumed to be a semi-sphere having a radius of curvature of r, the radius of r curvature of the tip is more than 0.5 µm and less than 1 µm,
wherein the conical portion has a cone angle of α of more than 5° and less than (8/r)°, wherein the cone angle is an opening angle of a cone constituting the conical portion, and wherein r is indicated in units of micrometers (µm), and
wherein the tip has a radius r of curvature of 0.55 µm or more and 0.7 µm or less, and wherein the conical portion has a cone angle α of 8° or more and 12° or less.

6. An electron beam apparatus comprising a Schottky emission electron source, the electron source including a single-crystal tungsten metal needle as an electron emission source; a barium (Ba) diffusion means; and a heater,
wherein the barium diffusion means comprises a porous sintered metal; and a barium diffusion source containing Ba—O.

7. The electron beam apparatus according to claim 6, further comprising a suppressor electrode which suppresses the barium diffusion means from emitting thermal electrons.

8. The electron beam apparatus according to claim 6, wherein the barium diffusion means comprises a sintered metal impregnated with a barium diffusion source containing barium oxide.

9. The electron beam apparatus according to claim 6, wherein the barium diffusion means comprises the barium diffusion source; and a sintered metal arranged outside the barium diffusion source.

10. The electron beam apparatus according to claim 9, wherein the barium diffusion means is a composite member comprising the barium diffusion source; the sintered metal arranged on the barium diffusion source; and the single-crystal tungsten metal needle bound to the sintered metal.

11. The electron beam apparatus according to claim 6, wherein the sintered metal is a sintered body of a powder mainly containing tungsten (W), nickel (Ni), chromium (Cr), and/or iron (Fe) and having a grain size of from 0.1 to 10 µm.

12. The electron beam apparatus according to claim 6, wherein the barium diffusion source is an oxide containing Ba—O, and wherein the oxide contains BaO alone or contains BaO in combination with CaO, SrO or a carbonate of Ba, Ca, or Sr.

13. The electron beam apparatus according to claim 6, wherein the barium diffusion source comprises barium chromate ($BaCrO_4$), barium manganate ($BaMnO_4$), or a mixture thereof; and particles of an alloy mainly containing Zr and/or Ti.

14. A method processing an electron source providing a single-crystal tungsten metal needle being shaped to have a cylindrical portion; a constricted portion arranged on and extending from the top of the cylindrical portion and having a tapered shape; and an approximately conical portion extending from the constricted portion, the method comprising the steps of:
(1) processing a cone angle of the conical portion by electrolytically etching with a direct current so as to be more than 5° and less than (8/r)°, wherein the cone angle is an opening angle of a cone constituting the conical portion, and wherein r is a radius of curvature and is indicated in units of micrometers (µm);
(2) removing the tip of the conical portion by etching; and
(3) processing the radius r of curvature of the tip to be more than 0.5 µm and less than 1 µm by heating at a temperature of more than 1800K when the tip of the conical portion is assumed to be a semi-sphere having the radius r of curvature.

* * * * *